(12) United States Patent
Chen et al.

(10) Patent No.: US 10,088,502 B2
(45) Date of Patent: Oct. 2, 2018

(54) TEST ASSEMBLY AND METHOD OF MANUFACTURING THE SAME

(71) Applicant: STAr TECHNOLOGIES, INC., Hsinchu (TW)

(72) Inventors: Ho Yeh Chen, Hsinchu (TW); Choon Leong Lou, Hsinchu (TW)

(73) Assignee: STAR TECHNOLOGIES, INC., Hsinchu (TW)

( * ) Notice: Subject to any disclaimer, the term of this patent is extended or adjusted under 35 U.S.C. 154(b) by 285 days.

(21) Appl. No.: 15/051,628

(22) Filed: Feb. 23, 2016

(65) Prior Publication Data
US 2016/0252548 A1    Sep. 1, 2016

(30) Foreign Application Priority Data

Feb. 26, 2015    (TW) .............................. 104106182 A (51) Int. Cl.
*G01R 31/00*    (2006.01)
*G01R 1/073*    (2006.01)
(Continued)

(52) U.S. Cl.
CPC ..... *G01R 1/07314* (2013.01); *G01R 1/07378* (2013.01); *G01R 3/00* (2013.01);
(Continued)

(58) Field of Classification Search
CPC ....... G01R 1/00; H01L 21/00; H01L 2221/00; H05K 1/00; H05K 2201/00; H05K 999/00
See application file for complete search history.

(56) References Cited

U.S. PATENT DOCUMENTS

| 2004/0012471 A1* | 1/2004 | Kojima ................. H01F 38/18 336/120 |
| 2004/0163252 A1 | 8/2004 | Khandros et al. |

(Continued)

FOREIGN PATENT DOCUMENTS

| CN | 1957262 | 5/2007 |
| JP | 2002-228710 | 8/2002 |

(Continued)

*Primary Examiner* — Jermele M Hollington
*Assistant Examiner* — Temilade Rhodes-Vivour
(74) *Attorney, Agent, or Firm* — Liu & Liu (57) ABSTRACT

A test assembly adapted to test a semiconductor device is provided. The test assembly includes a main circuit board, a space transformer, an intermediary supporting element, an adhesive element, a plurality of electrical connection elements and a plurality of test probes. The space transformer is disposed on the main circuit board and has a first surface and a second surface opposite to the first surface. The first surface faces the main circuit board. The intermediary supporting element is disposed between the main circuit board and the first surface. The adhesive element is disposed between the intermediary supporting element and the first surface. The space transformer is attached to the intermediary supporting element through the adhesive element. The electrical connection elements are disposed between the main circuit board and the first surface. Each of the electrical connection elements passes through the intermediary supporting element and the adhesive element such that the space transformer is electrically connected to the main circuit board through the electrical connection elements. The test probes are disposed on the second surface and electrically connected to the space transformer.

19 Claims, 5 Drawing Sheets

(51) Int. Cl.
*G01R 3/00* (2006.01)
*G01R 1/00* (2006.01)

(52) U.S. Cl.
CPC ............ *G01R 1/00* (2013.01); *G01R 1/07357* (2013.01); *H01L 2221/00* (2013.01); *H05K 999/00* (2013.01)

(56) References Cited

U.S. PATENT DOCUMENTS

| | | | |
|---|---|---|---|
| 2007/0075715 A1 | 4/2007 | Khandros et al. | |
| 2010/0301890 A1* | 12/2010 | Lou .................... | G01R 31/2891 324/750.16 |
| 2013/0027072 A1* | 1/2013 | Hsu .................... | G01R 31/2889 324/755.01 |
| 2014/0290053 A1* | 10/2014 | Chou ........................ | G01R 3/00 29/831 |
| 2015/0123690 A1* | 5/2015 | Kung ................. | G01R 1/07378 324/756.03 |
| 2015/0185252 A1* | 7/2015 | Yang ................. | G01R 31/2889 324/756.03 |

FOREIGN PATENT DOCUMENTS

| | | |
|---|---|---|
| JP | 2007-155507 | 6/2007 |
| JP | 2010-210478 | 9/2010 |
| TW | 200809214 | 2/2008 |
| TW | 200846668 | 12/2008 |
| WO | 2007142204 | 12/2007 |

* cited by examiner

TEST ASSEMBLY AND METHOD OF MANUFACTURING THE SAME

CROSS REFERENCE TO RELATED APPLICATIONS

This application is based on and claims the benefit of priority from Taiwan Patent Application 104106182 filed on Feb. 26, 2015, which is incorporated herein by reference and assigned to the assignee herein.

FIELD OF THE INVENTION

The present invention relates to a test assembly and a method of manufacturing the test assembly, and particularly relates to a test assembly for testing a semiconductor device and a method of manufacturing the test assembly.

DESCRIPTION OF THE PRIOR ART

Figure 1:
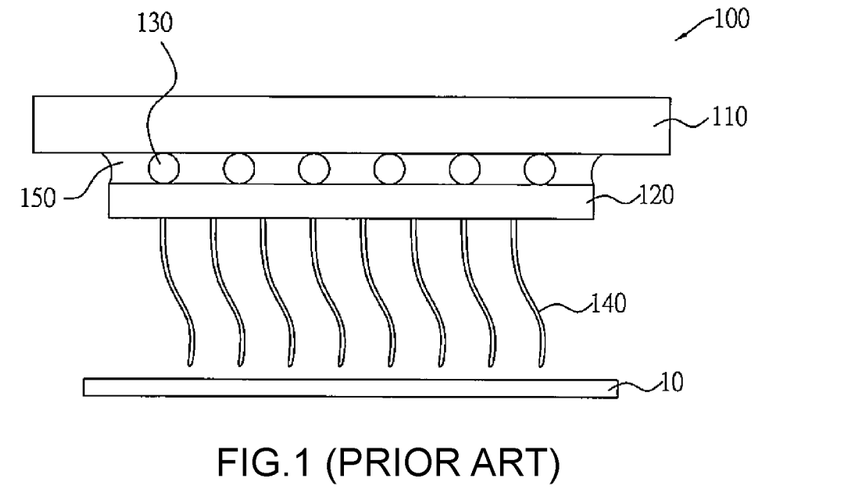
FIG. 1 is a schematic view of a conventional test assembly.

FIG. 1 is a schematic view of a conventional test assembly. Referring to FIG. 1, a conventional test assembly 100 is suitable for testing a semiconductor device 10 such as a wafer. The test assembly 100 comprises a main circuit board 110, a space transformer 120, a plurality of solder balls 130, a plurality of test probes 140 and an underfill 150. The space transformer 120 is disposed on the main circuit board 110. The solder balls 130 are disposed between the main circuit board 110 and the space transformer 120. The space transformer 120 is electrically connected to the main circuit board 110 through the solder balls 130. The test probes 140 are disposed on a side of the space transformer 120 opposite to the solder balls 130 and electrically connected to the space transformer 120.

The underfill 150 is filled between the main circuit board 110 and the space transformer 120 to enclose the solder balls 130. The underfill 150 reduces the thermal stress causing fatigue at junctions of the solder balls 130 so as to enhance the reliability of the points at which the main circuit board 110 and the space transformer 120 are soldered to the solder balls 130.

During a test conducted on the semiconductor device 10 with the test assembly 100, the semiconductor device 10 placed on a stage (not shown) thrusts upward to hit the test probes 140 under specific pressure. At this time, the underfill 150 and the solder balls 130 are also influenced by the aforesaid pressure. However, having been thrust and hit frequently for a long period of time, the underfill 150 cannot fully protect the solder balls 130 such that the good electrical connection between the main circuit board 110 and the space transformer 120 fails to remain. As a result, part of the solder balls 130 in the conventional test assembly 100 are likely to have cracks and even fracture after long or frequent use such that the electrical connection between the main circuit board 110 and the space transformer 120 is reversely affected.

Moreover, in the event of the aforesaid deterioration of electrical connection, a user who wants to dismount and reset the solder balls 130 will be hindered due to adhesion caused by the presence of the underfill 150.

SUMMARY OF THE INVENTION

The present invention provides a test assembly, wherein during a test process, defects of electrical connection elements between a main circuit board and a space transformer due to pressure exerted thereon are not easily produced.

The present invention provides a test assembly, wherein electrical connection elements between a main circuit board and a space transformer can be easily dismounted and reset because of the absence of the aforesaid adhesion of the underfill.

The present invention provides a test assembly suitable for testing a semiconductor device. The test assembly comprises a main circuit board, a space transformer, an intermediary supporting element, an adhesive element, a plurality of electrical connection elements and a plurality of test probes. The space transformer is disposed on the main circuit board and has a first surface and a second surface opposite to the first surface. The first surface faces the main circuit board. The intermediary supporting element is disposed between the main circuit board and the first surface. The adhesive element is disposed between the intermediary supporting element and the first surface. The space transformer is attached to the intermediary supporting element through the adhesive element. The electrical connection elements are disposed between the main circuit board and the first surface. Each of the electrical connection elements penetrates the intermediary supporting element and the adhesive element such that the space transformer is electrically connected to the main circuit board through the electrical connection elements. The test probes are disposed at the second surface and electrically connected to the space transformer.

According to an embodiment of the present invention, adhesion strength under which the adhesive element is attached to the space transformer is larger than pressure exerted by the electrical connection elements upon the space transformer.

According to an embodiment of the present invention, adhesion strength under which the adhesive element is attached to the intermediary supporting element is larger than pressure exerted by the electrical connection elements upon the space transformer.

According to an embodiment of the present invention, each of the electrical connection elements is a pogo pin.

According to an embodiment of the present invention, the test assembly further comprises a holding element disposed on the main circuit board. The holding element presses against the intermediary supporting element to maintain the positional relation between the intermediary supporting element and the main circuit board.

According to an embodiment of the present invention, the test assembly further comprises a holding element disposed on the main circuit board. The holding element presses against the space transformer to maintain the positional relation between the space transformer, the intermediary supporting element and the main circuit board.

According to an embodiment of the present invention, the adhesive element is a hot-melt adhesive.

According to an embodiment of the present invention, an assembled mechanism composed of the intermediary supporting element and the space transformer attached to the intermediary supporting element is detachably disposed on the main circuit board. The electrical connection elements are detachably disposed in the intermediary supporting element.

The present invention also provides a method of manufacturing a test assembly comprising the following steps. First, an adhesive element is disposed on a first surface of a space transformer. Afterwards, a plurality of through holes are formed in the adhesive element. Afterwards, an intermediary supporting element is attached to the first surface of the space transformer through the adhesive element. Afterwards, each of a plurality of electrical connection elements is disposed in one of a plurality of through holes of the intermediary supporting element and one of the through holes of the adhesive element such that each of the electrical connection elements penetrates the intermediary supporting element and the adhesive element. Afterwards, the space transformer, the intermediary supporting element and the electrical connection elements which have been assembled are disposed on a main circuit board such that the first surface faces the main circuit board and the space transformer is electrically connected to the main circuit board through the electrical connection elements. Thereafter, the test probes are disposed on a second surface of the space transformer opposite of the first surface such that the test probes are electrically connected to the space transformer.

The present invention further provides another method of manufacturing a test assembly comprising the following steps. First, an adhesive element is disposed on an intermediary supporting element. Afterwards, a plurality of through holes are formed in the adhesive element. Afterwards, a first surface of a space transformer is attached to the intermediary supporting element through the adhesive element. Afterwards, each of a plurality of electrical connection elements is disposed in one of a plurality of through holes of the intermediary supporting element and one of the through holes of the adhesive element such that each of the electrical connection elements penetrates the intermediary supporting element and the adhesive element. Afterwards, the space transformer, the intermediary supporting element and the electrical connection elements which have been assembled are disposed on a main circuit board such that the first surface faces the main circuit board and the space transformer is electrically connected to the main circuit board through the electrical connection elements. Thereafter, the test probes are disposed on a second surface of the space transformer opposite of the first surface such that the test probes are electrically connected to the space transformer.

According to an embodiment of the present invention, the step of attaching the intermediary supporting element to the first surface of the space transformer through the adhesive element comprises heating up the adhesive element to perform hot-melt adhesion between the intermediary supporting element and the first surface of the space transformer.

According to an embodiment of the present invention, the step of forming the through holes in the adhesive element is carried out with a laser perforation process.

During a test conducted on the semiconductor device with the test assembly of each of the embodiments of the present invention, the assembled mechanism composed of the intermediary supporting element and the space transformer attached to the intermediary supporting element can bear part of the pressure caused by the semiconductor device thrusting upward and hitting the test probes. Therefore, compared with the prior art, after being used longer or frequently, the electrical connection elements of the test assembly of each of the embodiments of the present invention are less likely to get damaged such that the good electrical connection between the main circuit board and the space transformer can be still maintained.

The following description, the appended claims, and the embodiments of the present invention further illustrate the features and advantages of the present invention.

DETAILED DESCRIPTION OF THE EMBODIMENTS

First Embodiment

Figure 2:
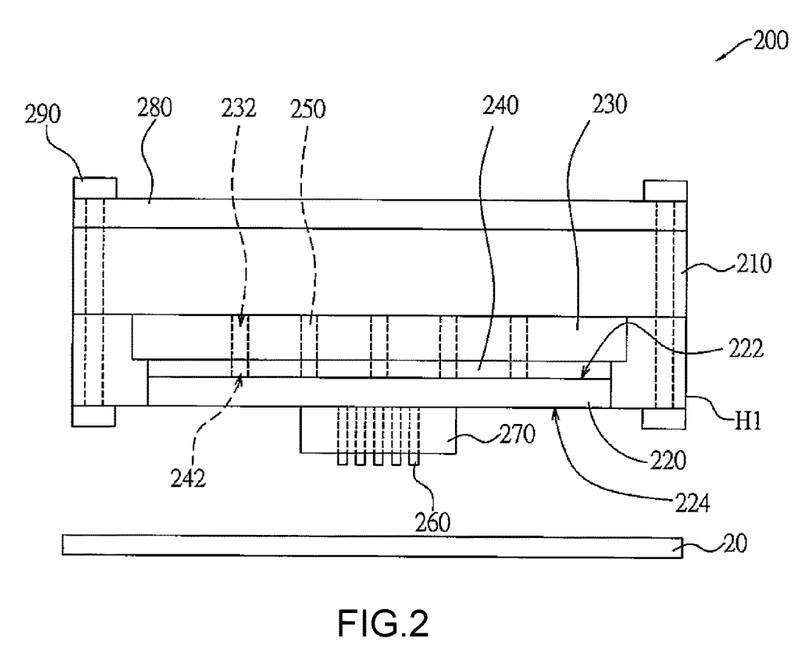
FIG. 2 is a schematic view of a test assembly according to a first embodiment of the present invention.

FIG. 2 is a schematic view of a test assembly according to a first embodiment of the present invention. Referring to FIG. 2, a test assembly 200 of the first embodiment is suitable for testing a semiconductor device 20 such as a wafer. The test assembly 200 comprises a main circuit board 210, a space transformer 220, an intermediary supporting element 230, an adhesive element 240, a plurality of electrical connection elements 250 and a plurality of test probes 260. The space transformer 220 is disposed on the main circuit board 210 and has a first surface 222 and a second surface 224 opposite to the first surface 222. The first surface 222 of the space transformer 220 faces the main circuit board 210.

The intermediary supporting element 230 is disposed between the main circuit board 210 and the first surface 222 of the space transformer 220 and has a plurality of through holes 232. The adhesive element 240 such as a hot-melt adhesive is disposed between the intermediary supporting element 230 and the first surface 222 of the space transformer 220 and has a plurality of through holes 242. The space transformer 220 is attached to the intermediary supporting element 230 through the adhesive element 240.

The electrical connection elements 250 such as a plurality of pogo pins are disposed between the main circuit board 210 and the first surface 222 of the space transformer 220. Each of the electrical connection elements 250 is disposed in one of the through holes 232 of the intermediary supporting element 230 and one of the through holes 242 of the adhesive element 240 such that each of the electrical connection elements 250 penetrates the intermediary supporting element 230 and the adhesive element 240. In this embodiment, the intermediary supporting element 230 can be a pogo housing, and the electrical connection elements 250 such as the pogo pins are detachably disposed in the intermediary supporting element 230.

The space transformer 220 is electrically connected to the main circuit board 210 through the electrical connection elements 250. Specifically, one of electrical pads (not shown) disposed on the first surface 222 of the space transformer 220 is electrically connected to one of electrical pads (not shown) of the main circuit board 210 through one of the electrical connection elements 250. The space transformer 220 has therein a wiring and thus can be regarded as another circuit board.

In this embodiment, the adhesion strength under which the adhesive element 240 is attached to the space transformer 220 is larger than the pressure exerted by the electrical connection elements 250, such as pogo pins, upon the space transformer 220. In this embodiment, the adhesion strength under which the adhesive element 240 is attached to the intermediary supporting element 230 is also larger than the pressure exerted by the electrical connection elements 250, such as pogo pins, upon the space transformer 220.

In the first embodiment, the test assembly 200 further comprises a probe head 270. The probe head 270 and the test probes 260 are disposed on the second surface 224 of the space transformer 220. The test probes 260 penetrate the probe head 270 to be electrically connected to the space transformer 220. Specifically, the test probes 260 are electrically connected to electrical pads (not shown) disposed on the second surface 224 of the space transformer 220, respectively. In this embodiment, each of the test probes 260 is, for example, a vertical-type probe exemplified by a pogo probe. However, in another embodiment, each of the test probes 260 is a buckling beam probe (not shown). In addition to the vertical-type probe, each of the test probes 260 can be a probe of any type but is not shown in any figures. In yet another embodiment, the probe head 270 is dispensed with.

In this embodiment, the test assembly 200 further comprises a main stiffener 280, a plurality of fasteners 290 and a holding element H1. Each of the fasteners 290 is, for example, a bolt. The main stiffener 280 is fixedly disposed on the main circuit board 210 through the fasteners 290. The main stiffener 280 reinforces the structural strength of the main circuit board 210. The main stiffener 280 and the space transformer 220 are disposed on two opposite sides of the main circuit board 210, respectively.

The holding element H1 is disposed on the main circuit board 210 by the fasteners 290. The holding element H1 presses against the intermediary supporting element 230 to maintain the positional relation between the intermediary supporting element 230 and the main circuit board 210. In this embodiment, an assembled mechanism composed of the intermediary supporting element 230 and the space transformer 220 attached to the intermediary supporting element 230 is detachable. That is, the assembled mechanism is detachably disposed on the main circuit board 210.

A method of manufacturing the test assembly 200 according to this embodiment is described below. FIG. 3A through FIG. 3E are schematic views of the method of manufacturing the test assembly of FIG. 2. First, referring to FIG. 3A, the adhesive element 240 is disposed on the first surface 222 of the space transformer 220. Afterwards, referring to FIG. 3B, the through holes 242 are formed in the adhesive element 240. In this embodiment, the step of forming the through holes 242 in the adhesive element 240 is carried out with a laser perforation process. Afterwards, referring to FIG. 3C, the intermediary supporting element 230 is attached to the first surface 222 of the space transformer 220 through the adhesive element 240. In this embodiment, the step of attaching the intermediary supporting element 230 to the first surface 222 of the space transformer 220 through the adhesive element 240 comprises heating up the adhesive element 240 to perform hot-melt adhesion between the intermediary supporting element 230 and the first surface 222 of the space transformer 220. However, in another embodiment, the aforesaid three steps can be replaced by three steps as follows: placing the adhesive element on the intermediary supporting element; forming the through holes in the adhesive element; and attaching the first surface of the space transformer to the intermediary supporting element through the adhesive element. However, the aforementioned three replacing steps are not shown in any figures.

Figure 3A:
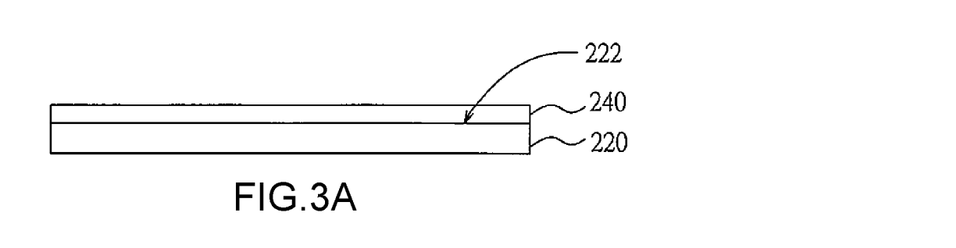
FIG. 3A through FIG. 3E are schematic views of the method of manufacturing the test assembly of FIG. 2.
Figure 3B:
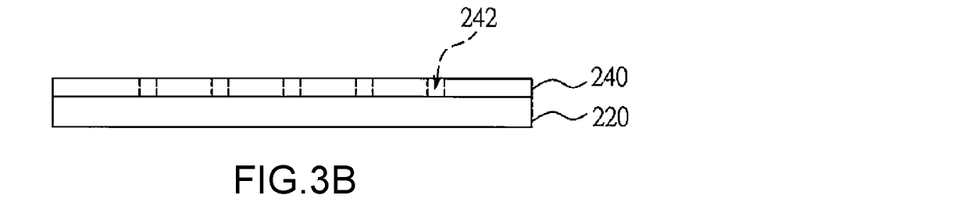
Figure 3C:
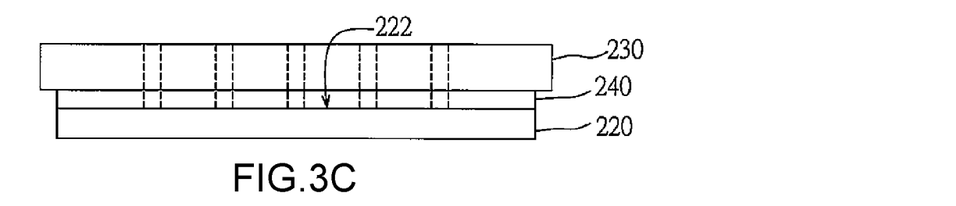
Figure 3D:
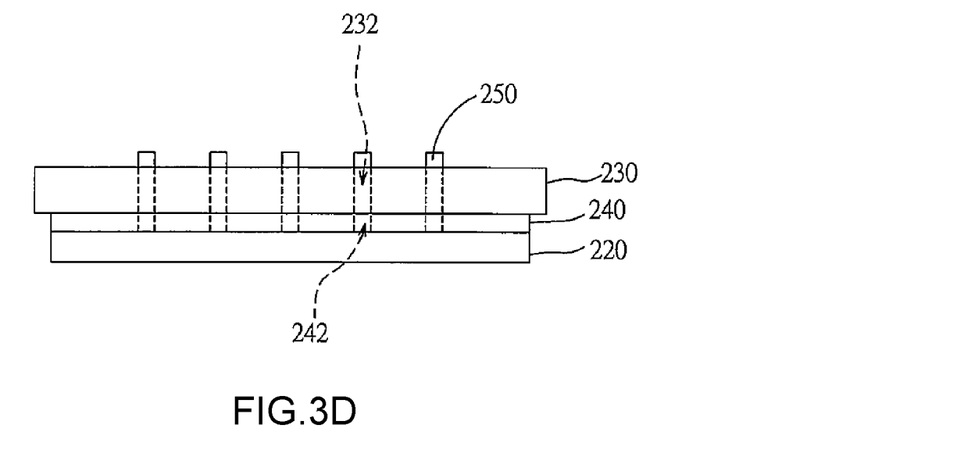
Figure 3E:
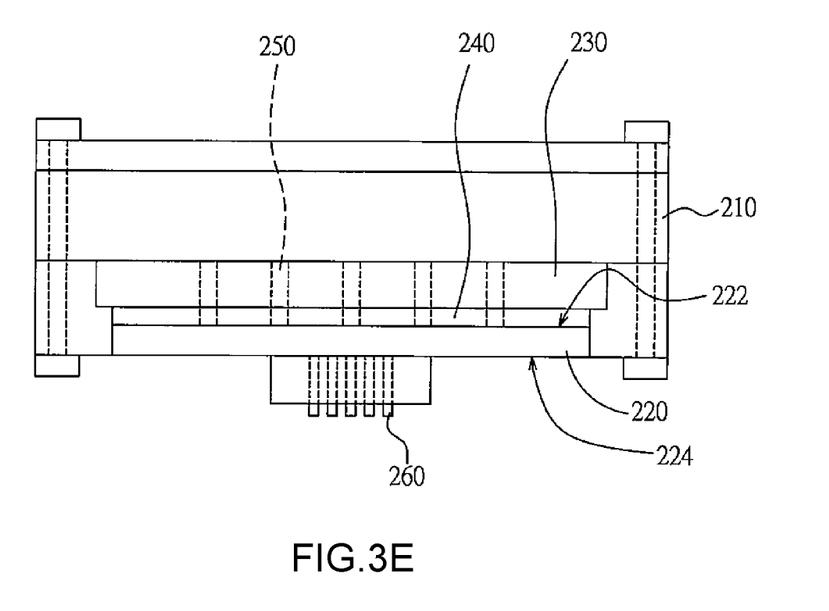

Afterwards, referring to FIG. 3D, each of the electrical connection elements 250 is disposed in one of the through holes 232 of the intermediary supporting element 230 and one of the through holes 242 of the adhesive element 240 such that each of the electrical connection elements 250 penetrates the intermediary supporting element 230 and the adhesive element 240. Afterwards, referring to FIG. 3E, the space transformer 220, the intermediary supporting element 230 and the electrical connection elements 250 which have been assembled are disposed on the main circuit board 210 such that the first surface 222 of the space transformer 220 faces the main circuit board 210 and the space transformer 220 is electrically connected to the main circuit board 210 through the electrical connection elements 250. Thereafter, referring to FIG. 3E again, the test probes 260 are disposed on the second surface 224 of the space transformer 220 opposite to the first surface 222 such that the test probes 260 are electrically connected to the space transformer 220.

Referring to FIG. 2 again, during a test conducted on the semiconductor device 20 with the test assembly 200, the semiconductor device 20 placed on a stage (not shown) thrusts upward to hit the test probes 260 under specific pressure. At this time, the intermediary supporting element 230 and the electrical connection elements 250 are also influenced by the aforesaid pressure. However, the assembled mechanism composed of the intermediary supporting element 230 and the space transformer 220 attached to the intermediary supporting element 230 has sufficient compressive strength to bear part of the aforesaid pressure. Therefore, compared with the prior art, after being used longer or frequently, the electrical connection elements 250 of the test assembly 200 of this embodiment are less likely to get damaged such that the good electrical connection between the main circuit board 210 and the space transformer 220 can be still maintained.

Nonetheless, after being used much longer or frequently, the electrical connection elements 250 get damaged inevitably and thus the electrical connection between the main circuit board 210 and the space transformer 220 is reversely affected. However, since the assembled mechanism composed of the intermediary supporting element 230 and the space transformer 220 attached to the intermediary supporting element 230 is detachable, upon separation of the main circuit board 210 and the assembled mechanism, the damaged electrical connection elements 250 can be detached and then replaced with new electrical connection elements 250. Therefore, compared with the prior art, the electrical connection elements 250 of the test assembly 200 of this embodiment of the present invention can be easily dismounted and reset.

Second Embodiment

Figure 4:
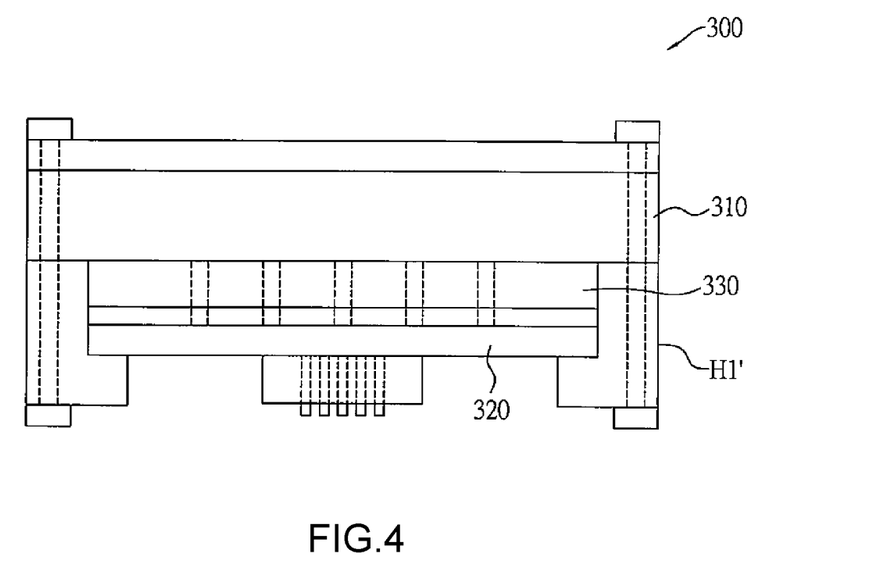
FIG. 4 is a schematic view of a test assembly according to a second embodiment of the present invention.

FIG. 4 is a schematic view of a test assembly according to a second embodiment of the present invention. Referring to FIG. 2 and FIG. 4, the difference between a test assembly 300 of the second embodiment and the test assembly 200 of the first embodiment lies in that a holding element H1' of the test assembly 300 of the second embodiment presses against a space transformer 320 to maintain the positional relation between the space transformer 320, an intermediary supporting element 330 and a main circuit board 310.

Each of the aforementioned embodiments of the present invention has one of the following advantages or another advantage. During a test conducted on the semiconductor device with the test assembly of each of the embodiments of the present invention, the assembled mechanism composed of the intermediary supporting element and the space transformer attached to the intermediary supporting element can bear part of the pressure caused by the semiconductor device thrusting upward and hitting the test probes. Therefore, compared with the prior art, after being used longer or frequently, the electrical connection elements of the test assembly of each of the embodiments of the present invention are less likely to get damaged such that the good electrical connection between the main circuit board and the space transformer can be still maintained.

Nonetheless, after being used much longer or frequently, the electrical connection elements of each of the aforementioned embodiments of the present invention get damaged inevitably. However, since the assembled mechanism composed of the intermediary supporting element and the space transformer attached to the intermediary supporting element is detachable, upon separation of the main circuit board and the assembled mechanism, the damaged electrical connection elements can be detached and then replaced with new electrical connection elements. Therefore, compared with the prior art, the electrical connection elements of the test assembly of each of the embodiments of the present invention can be easily dismounted and reset.

The foregoing detailed description of the embodiments is used to further clearly describe the features and spirit of the present invention. The foregoing description for each embodiment is not intended to limit the scope of the present invention. All kinds of modifications made to the foregoing embodiments and equivalent arrangements should fall within the protected scope of the present invention. Hence, the scope of the present invention should be explained most widely according to the claims described thereafter in connection with the detailed description, and should cover all the possibly equivalent variations and equivalent arrangements.

What is claimed is:

1. A test assembly, suitable for testing a semiconductor device, comprising:
    a main circuit board;
    a space transformer, disposed on the main circuit board and having a first surface and a second surface opposite to the first surface, wherein the first surface faces the main circuit board;
    an intermediary supporting element, disposed between the main circuit board and the first surface;
    an adhesive element, disposed between the intermediary supporting element and the first surface, wherein the space transformer is attached to the intermediary supporting element through the adhesive element;
    a plurality of electrical connection elements, disposed between the main circuit board and the first surface, wherein each of the electrical connection elements penetrates the intermediary supporting element and the adhesive element such that the space transformer is electrically connected to the main circuit board through the electrical connection elements; and
    a plurality of test probes, disposed at the second surface and electrically connected to the space transformer,
    wherein adhesion strength under which the adhesive element is attached to the intermediary supporting element is larger than pressure exerted by the electrical connection elements upon the space transformer.

2. The test assembly of claim 1, wherein each of the electrical connection elements is a pogo pin.

3. The test assembly of claim 1, further comprising a holding element disposed on the main circuit board, wherein the holding element presses against the intermediary supporting element to maintain the positional relation between the intermediary supporting element and the main circuit board.

4. The test assembly of claim 1, further comprising a holding element disposed on the main circuit board, wherein the holding element presses against the space transformer to maintain the positional relation between the space transformer, the intermediary supporting element and the main circuit board.

5. The test assembly of claim 1, wherein the adhesive element is a hot-melt adhesive.

6. The test assembly of claim 1, wherein an assembled mechanism composed of the intermediary supporting element and the space transformer attached to the intermediary supporting element is detachably disposed on the main circuit board, and the electrical connection elements are detachably disposed in the intermediary supporting element.

7. The test assembly of claim 1, wherein adhesion strength under which the adhesive element is attached to the space transformer is larger than pressure exerted by the electrical connection elements upon the space transformer.

8. A test assembly, suitable for testing a semiconductor device, comprising:
    a main circuit board;
    a space transformer, disposed on the main circuit board and having a first surface and a second surface opposite to the first surface, wherein the first surface faces the main circuit board;
    an intermediary supporting element, disposed between the main circuit board and the first surface;
    an adhesive element, disposed between the intermediary supporting element and the first surface, wherein the space transformer is attached to the intermediary supporting element through the adhesive element;
    a plurality of electrical connection elements, disposed between the main circuit board and the first surface, wherein each of the electrical connection elements penetrates the intermediary supporting element and the adhesive element such that the space transformer is electrically connected to the main circuit board through the electrical connection elements; and
    a plurality of test probes, disposed at the second surface and electrically connected to the space transformer,
    wherein adhesion strength under which the adhesive element is attached to the space transformer is larger than pressure exerted by the electrical connection elements upon the space transformer.

9. The test assembly of claim 8, wherein each of the electrical connection elements is a pogo pin.

10. The test assembly of claim 8, further comprising a holding element disposed on the main circuit board, wherein the holding element presses against the intermediary supporting element to maintain the positional relation between the intermediary supporting element and the main circuit board.

11. The test assembly of claim 8, further comprising a holding element disposed on the main circuit board, wherein the holding element presses against the space transformer to maintain the positional relation between the space transformer, the intermediary supporting element and the main circuit board.

12. The test assembly of claim 8, wherein the adhesive element is a hot-melt adhesive.

13. The test assembly of claim 8, wherein an assembled mechanism composed of the intermediary supporting element and the space transformer attached to the intermediary supporting element is detachably disposed on the main circuit board, and the electrical connection elements are detachably disposed in the intermediary supporting element.

14. A method of manufacturing a test assembly, comprising:
    disposing an adhesive element on a first surface of a space transformer;

forming a plurality of through holes in the adhesive element after disposing the adhesive element on the first surface of the space transformer;

attaching an intermediary supporting element to the first surface of the space transformer through the adhesive element;

disposing each of a plurality of electrical connection elements in one of a plurality of through holes of the intermediary supporting element and one of the through holes of the adhesive element such that each of the electrical connection elements penetrates the intermediary supporting element and the adhesive element;

disposing the space transformer, the intermediary supporting element and the electrical connection elements which have been assembled on a main circuit board such that the first surface faces the main circuit board and the space transformer is electrically connected to the main circuit board through the electrical connection elements; and disposing the test probes on a second surface of the space transformer opposite of the first surface such that the test probes are electrically connected to the space transformer.

15. The method of claim 14, wherein the step of attaching the intermediary supporting element to the first surface of the space transformer through the adhesive element comprises heating up the adhesive element to perform hot-melt adhesion between the intermediary supporting element and the first surface of the space transformer.

16. The method of claim 14, wherein the step of forming the through holes in the adhesive element is carried out with a laser perforation process.

17. A method of manufacturing a test assembly, comprising:

disposing an adhesive element on an intermediary supporting element;

forming a plurality of through holes in the adhesive element after disposing the adhesive element on the intermediary supporting element;

attaching a first surface of a space transformer to the intermediary supporting element through the adhesive element;

disposing each of a plurality of electrical connection elements in one of a plurality of through holes of the intermediary supporting element and one of the through holes of the adhesive element such that each of the electrical connection elements penetrates the intermediary supporting element and the adhesive element;

disposing the space transformer, the intermediary supporting element and the electrical connection elements which have been assembled on a main circuit board such that the first surface faces the main circuit board and the space transformer is electrically connected to the main circuit board through the electrical connection elements;

disposing the test probes on a second surface of the space transformer opposite of the first surface such that the test probes are electrically connected to the space transformer.

18. The method of claim 17, wherein the step of attaching the intermediary supporting element to the first surface of the space transformer through the adhesive element comprises heating up the adhesive element to perform hot-melt adhesion between the intermediary supporting element and the first surface of the space transformer.

19. The method of claim 17, wherein the step of forming the through holes in the adhesive element is carried out with a laser perforation process.

* * * * *